United States Patent [19]
Yamazaki

[11] Patent Number: 5,696,386
[45] Date of Patent: Dec. 9, 1997

[54] SEMICONDUCTOR DEVICE

[75] Inventor: Shunpei Yamazaki, Tokyo, Japan

[73] Assignee: Semiconductor Energy Laboratory Co. Ltd., Kanagawa-ken, Japan

[21] Appl. No.: 193,748

[22] Filed: Feb. 9, 1994

[30] Foreign Application Priority Data

Feb. 10, 1993 [JP] Japan ................................. 5-045786
Oct. 20, 1993 [JP] Japan ................................. 5-285988

[51] Int. Cl.$^6$ ................................................ H01L 29/04
[52] U.S. Cl. ........................ 257/57; 257/59; 257/347; 257/506
[58] Field of Search ....................... 257/770, 347, 257/506, 77, 57, 59

[56] References Cited

U.S. PATENT DOCUMENTS

| 4,876,582 | 10/1989 | Janning ................. 257/507 |
| 5,134,018 | 7/1992 | Tokunaga ................. 257/705 |
| 5,147,826 | 9/1992 | Liu et al. . |
| 5,275,851 | 1/1994 | Fonash et al. . |
| 5,485,019 | 1/1996 | Yamazaki et al. ................. 257/59 |

FOREIGN PATENT DOCUMENTS 5-21763  1/1993  Japan ................................. 257/347

OTHER PUBLICATIONS

C. Hayzelden et al., "In Situ Transmission Electron Microscopy Studies of Silicide-Mediated Crystallization of Amorphous Silicon"(3 pages).
A.V. Dvurechenskii et al., "Transport Phenomena in Amorphous Silicon Doped by Ion Implantation of 3d Metals", Akademikian Lavrentev Prospekt13, 630090 Novosibirsk 90, USSR, pp. 635–640.
T. Hempel et al., "Needle-Like Crystallization of Ni Doped Amorphous Silicon Thin Films", Solid State Communications, vol. 85, No. 11, pp. 921–924, 1993.

Primary Examiner—Sara W. Crane
Assistant Examiner—Roy Potter
Attorney, Agent, or Firm—Sixbey, Friedman, Leedom & Ferguson; Gerald J. Ferguson, Jr.; Jeffrey L. Costellia

[57] ABSTRACT

A method relates to fabrication of semiconductor devices such as TFTs on an insulating substrate. After forming a coating consisting mainly of aluminum nitride, semiconductor devices such as TFTs or semiconductor integrated circuits comprising said semiconductor devices are built directly or indirectly on the coating to form e.g. an active matrix liquid crystal display. A coating consisting mainly of silicon oxide may be formed on the coating consisting mainly of aluminum nitride and under said semiconductor devices or said semiconductor integrated circuits.

18 Claims, 6 Drawing Sheets

SEMICONDUCTOR DEVICE

BACKGROUND OF THE INVENTION

1. Field of the Invention

The present invention relates to a method for forming an insulated gate semiconductor device and an integrated circuit (IC) comprising such devices with a high reliability. The present invention also relates to a semiconductor device having fabricated by the above process. It further relates to a highly reliable semiconductor device. The semiconductor devices according to the present invention are suited for use in, for example, active matrix-driven liquid crystal displays utilizing a thin film transistor (TFT), driver circuits of image sensors, etc., as well as for SOI integrated circuits and for conventional semiconductor integrated circuits (e.g., microprocessors, microcontrollers, microcomputers, semiconductor memories, etc.).

2. Prior Art

Recently, much effort is paid on the study of fabricating a MISFET, i.e., an insulated gate semiconductor device having formed on an insulating substrate or an insulating surface isolated from a semiconductor substrate by incorporating a thick insulator film between the semiconductor substrate and the device. Particularly, a semiconductor device having a semiconductor layer (an active layer)in the form of a thin film is called a thin film transistor (TFT). It is difficult to obtain an element having favorable crystallinity (e.g. monocrystal semiconductor) as such a semiconductor device. Accordingly, a non-single crystalline semiconductor, i.e. , a crystalline semiconductor other than a single crystal semiconductor, had been used generally in MISFETs.

The non-single crystalline semiconductors comprise defects at high density, and are usually neutralized previously with an element such as hydrogen and fluorine to use them in a practically defect-free state. The neutralization process can be carried out by, for example, hydrogenation. The bond between hydrogen and the semiconductor element such as silicon is generally weak, and would easily undergo breakage to cause decomposition of the resulting compound on applying a thermal energy corresponding to a mere one hundred and several tens of degrees Centigrade. Accordingly, when electric voltage or current is applied for a long duration of time, hydrogen readily undergoes desorption due to the local heat up of the semiconductor. This phenomena remarkably causes degradation of the semiconductor. In particular, TFT for controlling a large current, for example, a driver TFT provided in a peripheral circuit for driving an active matrix circuit with the peripheral circuit and the active matrix circuit being provided in a monolithic form yields a large heat since such a driver TFT has a channel width of 200 μm or longer, and a large current is turned on and off.

The present invention has been achieved in the light of the aforementioned circumstances.

SUMMARY OF THE INVENTION

An object of the present invention is to provide a semiconductor device having such a structure that the local heat generated during its usage can be rapidly released to make the whole thin film circuit device thermally uniform, and also to provide a process for fabricating the device.

A first embodiment of the present invention provides a thin film semiconductor device comprising a substrate having provided thereon a film comprising aluminum nitride as the principal component, having directly or indirectly formed thereon a semiconductor film comprising silicon as the principal component, and having further established directly or indirectly thereon a wiring made of a material such as a metal and a semiconductor.

The present invention also provides a process for fabricating a thin film semiconductor device having the above structure. Accordingly, a second embodiment of the present invention provides a process which comprises forming a film containing aluminum nitride as the principal component on a substrate especially a substrate poor in thermal conductivity and having a good heat retaining property, forming thereon either directly or indirectly a semiconductor film comprising silicon as the principal component, and further establishing thereon either directly or indirectly a wiring made of a material such as a metal and a semiconductor.

Aluminum nitride is a superior conductor of heat and is suited for applications in which light transmitting properties are required, because it has an optical gap of 6.2 eV and is thereby transparent to visible light and near ultraviolet light. The aluminum nitride film is formed by deposition processes such as sputtering, reactive sputtering, and MOCVD (metal-organic chemical vapor deposition) or plasma CVD. In obtaining an aluminum nitride film by a reactive sputtering process, the process is preferably conducted under nitrogen gas atmosphere using an aluminum target. For achieving sufficient heat emission with the aluminum nitride film in accordance with the object of the present invention, the aluminum nitride film is preferably deposited at a thickness of from 500Å to 5 μm, typically 1000 to 5000Å. An aluminum nitride film 5 μm or more in thickness was not practically feasible because the deposited film could be easily peeled off.

The thus obtained aluminum nitride film exerts a blocking effect against mobile ions such as sodium. Accordingly, the film protects the semiconductor device against the intrusion of such mobile ions.

The aluminum nitride film need not contain nitrogen and aluminum at a stoichiometric ratio so long as the thermal conductivity of the film is not impaired. Typically, a preferred aluminum to nitrogen ratio (aluminum/nitrogen) is in the range of 0.9 to 1.4, and the thermal conductivity of the film is preferably 0.6 W/cm.K or higher. This value can be contrasted to 2 W/cm.K for single crystal aluminum nitride.

The tension of the film may be controlled optimally by changing the compositional ratio of nitrogen and aluminum. Otherwise, a trace amount of boron, silicon, carbon, oxygen, etc., may be incorporated at 0.01 to 20 atom % to match or optimally control the stress with the substrate or minimize the strain of the stress. The film containing aluminum nitride as the principal component may be either crystalline or amorphous.

In general, a high thermal conductivity can be achieved by incorporating a diamond material such as a thin film of polycrystalline diamond, a hard carbon film, or a diamond-like carbon film. When a small area as the one in the device according to the present invention is considered, however, a satisfactory effect cannot be obtained because a tight adhesion cannot be obtained between a diamond material and a silicon oxide material. A silicon nitride film which is frequently used in a semiconductor process as a blocking layer and a passivation layer is not suited in that the thermal conductivity thereof is low. The characteristics of the well known materials for thin films were evaluated, and the results are summarized below for comparison.

| | AlN[1] | DLC[2] | SnO$_2$[3] | SiN$_x$[4] |
|---|---|---|---|---|
| Adhesibility[5] | ○ | △ | ○ | ○ |
| Light transmittance | ○ | △ | ○ | ○ |
| Mechanical strength | ○ | ○ | △ | ○ |
| Thermal conductivity | ○ | ○ | ○ | △ or X |
| Heat resistance | ○ | △ | △ | ○ |
| Sodium blocking effect | ○ | △ | △ | ○ |

Note:
[1] AlN: Aluminum nitride,
[2] DLC: Diamond-like carbon,
[3] SnO$_2$: Tin oxide, and
[4] SiN$_x$: Silicon nitride.
[5] "Adhesibility" signifies adhesibility to silicon oxide.

The symbols ○, △, and x in the evaluation represent "good," "fair," and "poor," respectively.

In the device according to the present invention, the heat having generated from the metallic or semiconductor wiring (e.g., gate wiring, etc.) is transferred to the underlying semiconductor films (e.g., active layers, etc.), and the semiconductor films themselves generate heat by the electric current applied thereto. Accordingly, the semiconductor films are heated to a higher temperature, but the heat is rapidly transferred to an aluminum nitride film provided under the semiconductor film to prevent heat accumulation from occurring on the semiconductor film. In this manner, the temperature of the wiring and the semiconductor film can be suppressed to avoid hydrogen desorption. In particular, the prevention of the heat accumulation for making the heat uniform suppresses a local degradation of the TFT even if a local heat generation is caused by generation of a hot carrier by applying a reverse bias voltage between the drain and the channel of the TFT.

To deposit a semiconductor film directly on the aluminum nitride film is preferred in order to improve adhesion of the semiconductor film. However, a carrier of the semiconductor is trapped in the aluminum nitride to readily generate a parasitic channel by the trapped carrier (trapping center). As a result, an unfavorable influence is cast on the electric properties of the semiconductor film. There is no problem in case that such trapping center can be eliminated. In case that such trapping center can not readily be eliminated, it is preferable to provide, between the semiconductor film and the aluminum nitride film, a material having favorable electric and chemical influence on the semiconductor film, e.g. silicon oxide having several tens times lower trapping center density than the aluminum nitride. Further, the silicon oxide can arreviate stress.

Alternatively, a silicon nitride film may be formed from 100 to 1000Å, e.g. 200Å, on the aluminum nitride film, and a silicon oxide film may be further formed from 100 to 2000Å, e.g. 200Å on the silicon nitride film. In the device according to the present invention, the gate contact may be made from single elements such as silicon (inclusive of an impurity-doped one having an improved conductivity), aluminum, tantalum, chromium, tungsten, and molybdenum, or from an alloy or a multilayered film thereof. Furthermore, the surface thereof may be oxidized as described in the Examples referred hereinafter.

Aluminum nitride may be used positively as an etching stopper, because the aluminum nitride would not be etched by any etching method commonly used for etching silicon oxide, silicon, aluminum, etc., in an ordinary fabrication process for semiconductor devices since the aluminum nitride is not etched by an etchant of fluorine group. That is, not only an upper surface but also a side surface of source or drain of the TFT can be used as a contact to the source or drain. For example, even if a contact hole is formed projecting out of the source or drain, the substrate is not etched since the aluminum nitride acts as an etching stopper. As a result, the source or drain region can be formed smaller than the conventional source or drain region. This is advantageous for integration of a circuit. Also, it is possible to make a contact large enough to obtain a reliable contact. This is advantageous for mass-productivity and reliability.

DETAILED DESCRIPTION OF THE INVENTION

The present invention is illustrated in greater detail referring to a non-limiting example below. It should be understood, however, that the present invention is not to be construed as being limited thereto.

EXAMPLE 1

An example of the fabrication of a TFT according to the present invention is illustrated in FIG. 1. First, a substrate 101 of Corning 7059 glass measuring 300 mm by 300 mm or 100 mm by 100 mm is prepared. An aluminum nitride film 102 having a thickness of 2000 to 5000 Å is deposited by reactive sputtering techniques. Using the aluminum as a target, a sputtering process is performed in an atmosphere of nitrogen and argon. Where the ratio of the nitrogen is 20% or more, a coating having good thermal conductivity is derived. Where the pressure at the time of sputtering is $1 \times 10^{-4}$ to $1 \times 10^{-2}$ torr, favorable results can be obtained. The deposition rate is 20 to 200 Å/min. During deposition, the substrate temperature can be increased to 100°–500°C.

The aluminum nitride film 102 is formed on both faces of the substrate to confine foreign elements such as sodium, either contained in the substrate or adhered to the surface after shipment, for preventing deterioration in the characteristics of the TFTs. The aluminum nitride film 1102 also serves to reinforce the surface of the substrate, for preventing the surface from being scratched. Especially, where TFTs are used in an active-matrix liquid-crystal display, the surface having no TFTs is exposed to the external environment and easily scratched. If scratches are formed, they reflect light irregularly, thereby darkening the screen.

Next, the glass substrate having formed thereon the aluminum nitride is annealed at 600° to 680° C., e.g. 640° C., for 4 to 10 hours in an atmosphere of nitrogen, ammonia (NH$_3$) or dinitrogen monoxide (N$_2$O). The substrate is slowly cooled at 0.01 to 0.5 °C./min, e.g. 0.2 °C./min, to a temperature of 350° to 450° C., and is taken out at this temperature. The substrate yellowed immediately after the reactive sputtering turns transparent, and the electrical insulating property is improved. Further, the glass substrate is thermally contracted in this annealing step to alleviate the stress. As a result, an irreversible contraction is decreased. For this reason, the substrate is not contracted in the later thermal process to remarkably decrease a mask misalignment.

After the annealing step, a silicon oxide film 103 acting as a base layer and having a thickness of 2000 to 500 Å is formed on the surfaces on which TFTs are to be formed. To form this oxide film, sputtering may be performed in an oxygen atmosphere. Alternatively, TEOS may be decomposed and deposited by plasma CVD in an ambient of oxygen. Further, the resulting film may be annealed at 450° to 650°C.

Figure 1A:
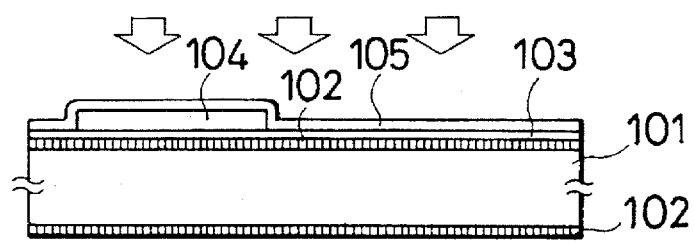
FIGS. 1(A) to 1(F) are cross-sectional views illustrating a method for forming a TFT in accordance with EXAMPLE 1 of the present invention.

Then, an amorphous silicon film is deposited to a thickness of 100 to 1500 Å, preferably 300 to 800 Å, by plasma CVD or LPCVD as shown in FIG. 1(A). This film is photolithographically patterned into island silicon regions 104. A silicon oxide film 105 having a thickness of 200 to 1500 Å, preferably 500 to 1000 Å, is then formed. This silicon oxide film serves also as a gate-insulating film. Therefore, sufficient care must be paid in fabricating this film. In the present example, the film is fabricated from TEOS. TEOS is decomposed and deposited together with oxygen at a substrate temperature of 150° to 600° C., preferably 300° to 450° C., by RF plasma CVD. The ratio of the pressures of TEOS and oxygen is 1:1 to 1:3. The pressure is 0.05 to 0.5 torr. The RF power is 100 to 250 W. Alternatively, the film can be fabricated from TEOS together with ozone gas by low-pressure CVD or atmospheric pressure CVD at a substrate temperature of 350° to 600° C., preferably 400° to 550° C. After the formation of the film, the laminate is annealed at 400° to 600° C. for 30 to 60 minutes in an atmosphere of oxygen or ozone.

Then, as shown in FIG. 1(A), the laminate is irradiated with KrF excimer laser radiation having a wavelength of 248 nm and a pulse width of 20 nsec to crystallize the silicon region 104. The energy density of the laser radiation is 200 to 400 mJ/cm$^2$, preferably 250 to 300 mJ/cm$^2$. During laser irradiation, the substrate is heated to 300° to 500° C. The crystallinity of the silicon film 104 formed in this way has been examined by Raman spectroscopy, and a relatively broad peak was observed in the vicinity of a 515 cm$^{-1}$ different from the peak (521 cm$^{-1}$) of the single crystal of silicon. Then, the laminate is annealed at 350° C. for 2 hours in an atmosphere of hydrogen.

Subsequently, an aluminum film having a thickness of 2000 Å to 1 μm is formed by electron-beam evaporation and patterned photolithographically to form gate electrodes 106. The aluminum can be doped with 0.15 to 0.2 weight % scandium (Sc). The substrate is immersed in an ethylene glycol solution of 1–3% tartaric acid having a pH of about 7. The substrate is anodized while using a platinum plate as a cathode and this gate electrode of aluminum as an anode. At the beginning of anodization, the applied voltage is increased up to 220 V with a constant current. This condition is maintained for 1 hour and then the process is ended. In the present example, the appropriate rate at which the voltage is increased is 2 to 5 V/min. under the constant-current state.

Figure 1B:
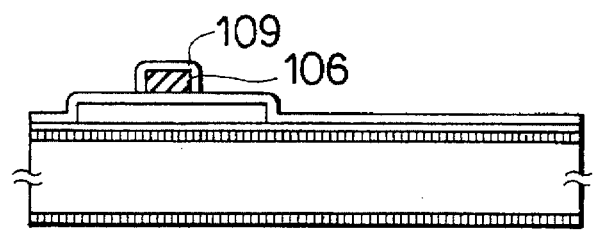

In this way, an anodic oxide 107 having a thickness of 1500 to 3500ÅÅ, e.g. 2000 Å, is formed (FIG. 1(B)).

Subsequently, impurity ions, or phosphorus ions, are implanted into the island silicon regions of TFTs by a self-aligning ion doping process (also known as a plasma doping process) while using the gate electrodes as a mask. Phosphine (PH$_3$) is used as the doping gas. The dose is 1 to 4×10$^{15}$ ions/cm$^2$.

Figure 1C:
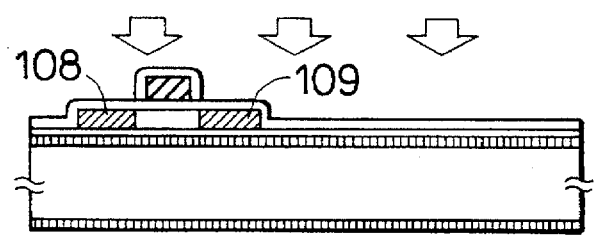
Figure 1D:
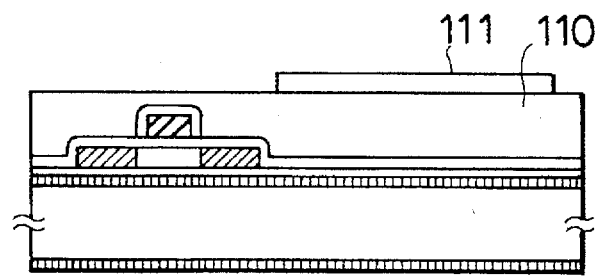

Then, as shown in FIG. 1(C), the laminate is irradiated with KrF excimer laser radiation having a wavelength of 248 nm and a pulse width of 20 nsec to improve the crystallinity of the silicon film, which deteriorates due to the ion doping. At this time, the energy density of the laser radiation is 150 to 400 mJ/cm$^2$, preferably 200 to 250 mJ/cm$^2$. In this way, N-type phosphorus-doped regions 108 and 109 are formed. The sheet resistance of these regions is 200 to 800 Ω/cm$^2$. In this step, RTP (rapid thermal process) in which the sample is heated at a temperature of 1000° to 1200° C. (temperature of silicon monitor) in a short period of time using flash lamp instead of laser may be used.

Then, a silicon oxide film is deposited as an interlayer insulator 110 having a thickness of 3000 Å over the whole surface by plasma CVD using both TEOS and oxygen or by low-pressure or atmospheric-pressure CVD using TEOS and ozone. The substrate temperature is 250° to 450° C., e.g. 350° C. After the formation of the film, this silicon oxide film is mechanically polished to flatten the surface. Furthermore, ITO is deposited by sputtering and patterned photolithographically to form pixel electrodes 111 (FIG. 1(D)).

Figure 1E:
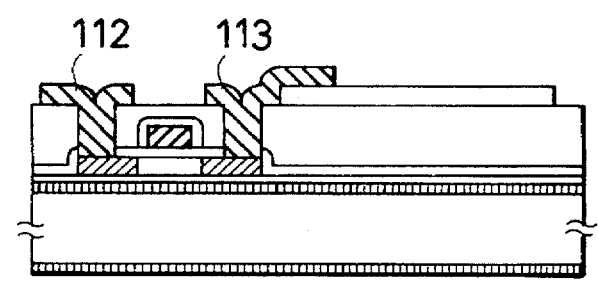

As shown in FIG. 1(E), the interlayer insulator 110 is etched to form contact holes in the source/drain region of each TFT. Wiring layers 112 and 113 of chromium or titanium nitride are formed, the wiring layer 113 being connected with the pixel electrodes 111.

Figure 1F:
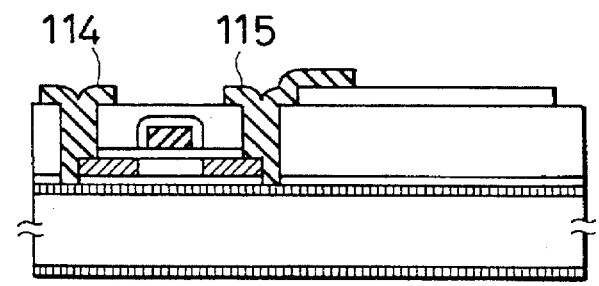

By the way, the contact holes may be formed projecting out of the source/drain region (silicon island) as shown in FIG. 1(F). The portion of the contact hole which projects out of the silicon island accounts for 30 to 70% of the entire area of the contact hole. In this case, contact is formed not only on a top surface but also on a side surface of the source/drain. This contact is referred to as top side contact hereinafter. Conventionally, even if top side contact is tried to be formed, a base silicon oxide film and substrate provided outside the silicon island are etched by the etching step of the interlayer insulator. But etching is stopped at the aluminum nitride etching stopper 102 in the present example.

In usual case, it is necessary to make the size of the contact hole smaller than that of the source/drain. The size of the island can be made smaller than that of the contact hole in the top side contact. As a result, the island can be made fine. Also, because the contact hole can be made large, mass-productivity and reliability can be heightened.

Finally, the laminate is annealed at 300° to 400° C. for 0.1 to 2 hours in an ambient of hydrogen, thus completing hydrogenation of the silicon. In this manner, TFTs are completed. Numerous TFTs manufactured at the same time are arranged in rows and columns to build an active-matrix liquid-crystal display.

EXAMPLE 2

An example of fabrication of an TFT according to the invention is illustrated in FIG. 2. First, an aluminum nitride film 202 having a thickness of 1000 Å to 5 μm is deposited on a substrate 201 (NA35 glass manufactured by NH technoglass Co., Ltd. by a reactive sputtering method. Using the aluminum as a target, sputtering is effected in an atmosphere of nitrogen and argon. Where the nitrogen accounts for more than 20%, a coating having good thermal conductivity is derived. During sputtering, a pressure of $1 \times 10^{-4}$ to $1 \times 10^{-2}$ torr produces favorable results. The deposition rate is 20 to 200 Å/min. During deposition, the substrate temperature can be increased to 100° to 500° C.

Then, a silicon oxide film having a thickness of 100 to 1000 Å, e.g. 500Å, is formed as an oxide film 203 forming a base layer. To form this oxide film, sputtering may be carried out in an oxygen atmosphere. Alternatively, TEOS may be decomposed and deposited by plasma CVD in an ambient of oxygen. Thereafter, this film is annealed at 500° to 700° C., e.g. 650° C., for four hours in a nitrogen atmosphere containing 20% dinitrogen monoxide ($N_2O$). By this annealing, the aluminum nitride film turns transparent and the silicon oxide film provided thereon can be highly densified.

Thereafter, an amorphous silicon film having a thickness of 200 to 1500 Å, preferably 300 to 800 Å, is deposited by plasma CVD or LPCVD. The laminate is annealed at 600° C. for 48 hours in a nitrogen atmosphere. The obtained crystalline silicon film is patterned photolithographically into island silicon regions 204. Silicon oxide is deposited as a gate-insulating film 207 having a thickness of 200 to 1500 Å, preferably 500 to 1000 Å.

A silicon film having a thickness of 2000 Å to 5 μm and doped with phosphorus is formed by low pressure CVD and photolithographically patterned to form gate electrodes 209 and wirings 208. Then, dopant ions, or phosphorus ions, are implanted into the island silicon regions of TFTs by a self-aligning ion doping process (also known as a plasma doping process) while using the gate electrodes as a mask. Phosphine ($PH_3$) is used as doping gas. The dose is 1 to $8 \times 10^{15}$ ions/$cm^2$.

The laminate is irradiated with KrF excimer laser radiation having a wavelength of 248 nm and a pulse width of 20 nsec to improve the crystallinity of the silicon film, which deteriorates due to ion doping. The energy density of the laser radiation is 150 to 400 mJ/$cm^2$, preferably 200 to 250 mJ/$cm^2$. In this way, N-type doped regions 205 and 206 are formed. The sheet resistance of these regions is 200 to 800 Ω/$cm^2$ (FIG. 2(A)).

Then, silicon oxide is deposited as an interlayer insulator 210 having a thickness of 3000 Å over the entire surface by plasma CVD, LPCVD, or atmospheric pressure CVD. A photoresist 211 is selectively applied. It is better to apply this photoresist at the intersections of wiring layers or at locations where contacts are attached to the wiring layers (FIG. 2(B)).

Figure 2A:
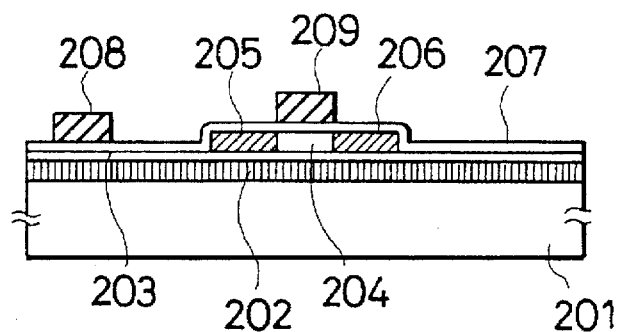
FIGS. 2(A) to 2(D) are cross-sectional views illustrating a method for forming a TFT in accordance with EXAMPLE 2 of the present invention.
Figure 2B:
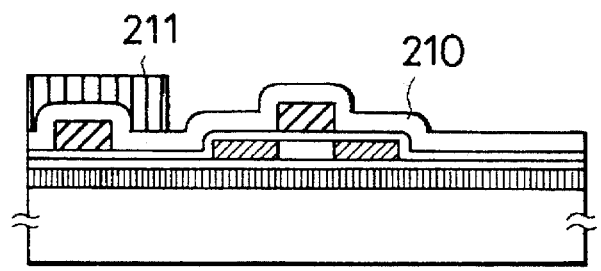
Figure 2C:
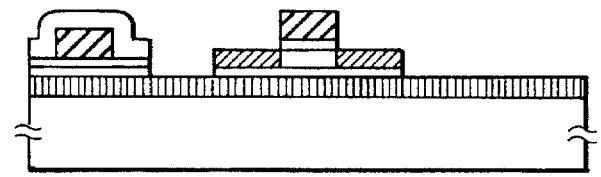
Figure 2D:
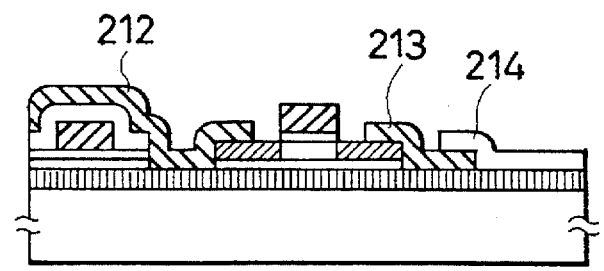
Figure 3A:
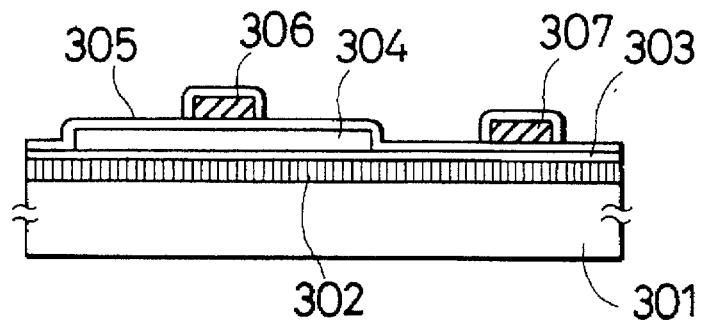
FIGS. 3(A) to 3(D) are cross-sectional views illustrating a method for forming a TFT in accordance with EXAMPLE 3 of the present invention.
Figure 3B:
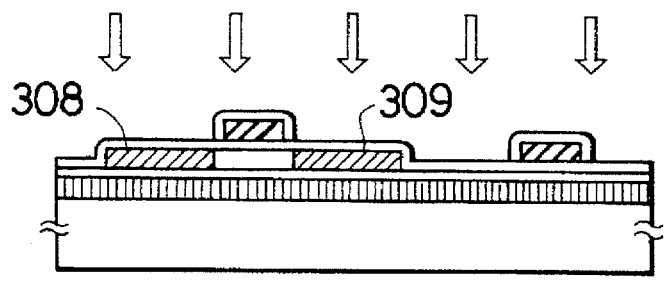
Figure 3C:
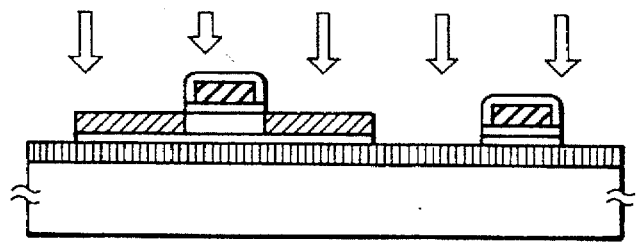
Figure 3D:
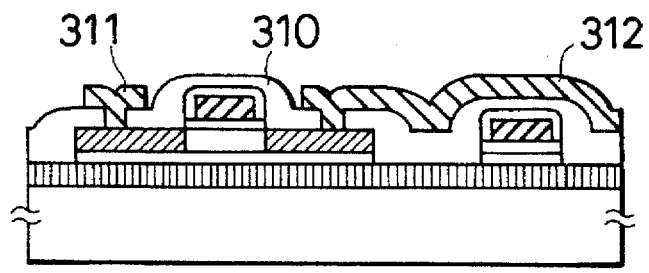

As shown in FIG. 2(C), using the photoresist 211 as a mask, the interlayer insulator 210, the gate insulator 207, and the base film 203 of silicon oxide are etched. Although the base film is etched away, the substrate is not etched away because the aluminum nitride film acts as a stopper. In this manner, a flat surface is obtained (FIG. 2(C)).

A titanium film having a thickness of 2000 Å to 5 μm is formed as a conductive interconnect material. This titanium film is patterned photolithographically to form wiring layers 212 and 213 connected with the source and drain of a TFT. ITO is selectively formed to produce pixel electrodes 214. Finally, the laminate processed in this way is annealed in a hydrogen at 350° C. for 30 minutes at 1 atm., thus completing hydrogenation of the laminate. In this way, one TFT is completed. Numerous TFTs manufactured at the same time were arranged in rows and columns to build an active-matrix liquid-crystal display.

EXAMPLE 3

An example of fabrication of a TFT according to the invention is illustrated in FIG. 3. The TFT of the present example is a TFT of a peripheral circuit for driving an active matrix circuit with the active matrix circuit and the peripheral circuit being provided in a monolithic form, especially a driver TFT having a channel width of 200 to 800 μm. Such a driver TFT generates a large heat since it controls a large current. For this reason, it is desired to diffuse heat rapidly by the base film of the present invention.

First, an aluminum nitride film 302 having a thickness of 2000 to 5000 Å is deposited on a substrate 301 of Corning 7059 by a reactive sputtering method. Using the aluminum as a target, sputtering is effected in an atmosphere of nitrogen and argon. Where the nitrogen accounts for more than 20%, a coating having good thermal conductivity is derived. During sputtering, a pressure of $1 \times 10^{-4}$ to $1 \times 10^{-2}$ torr produces favorable results. The deposition rate is 20 to 200 Å/min. During deposition, the substrate temperature can be raised to 100° to 500° C.

Then, a silicon oxide film is deposited as an oxide film 303 having a thickness of 1000 to 2000 Å and forming a base layer. To form this oxide film, sputtering may be carried out in an ambient of oxygen. Alternatively, TEOS may be decomposed and deposited by plasma CVD in an ambient of oxygen.

Subsequently, an amorphous silicon film having a thickness of 1000 to 3000 Å, preferably 1000 to 1500 Å, is deposited by plasma CVD or LPCVD. The laminate is annealed at 600° C. for 48 hours in a nitrogen atmosphere. The obtained crystalline silicon film is patterned photolithographically into island silicon regions 304. Silicon oxide is deposited as a gate-insulating film 305 having a thickness of 200 to 1500 Å, preferably 500 to 1000 Å.

An aluminum film having a thickness of 2000 Å to 5 μm is formed by electron-beam evaporation and photolithographically patterned. The laminate is anodized under the same conditions as in Example 1 to form gate electrodes 306 and a wiring layer 307 (FIG. 3(A)).

Then, impurity ions, or phosphorus ions, are implanted into the island silicon regions of TFTs by a self-aligning ion doping process (also known as a plasma doping process) while using the gate electrodes as a mask. Phosphine ($PH_3$) is used as doping gas. The dose is 2 to $8 \times 10^{15}$ ions/$cm^2$ (FIG. 3(B)).

The silicon oxide film 303 acting as a base layer is etched. The etching is terminated by the aluminum nitride film 302 acting as a stopper. Under this condition, the laminate is irradiated with KrF excimer laser radiation having a wavelength of 248 nm and a pulse width of 20 nsec to improve the crystallinity of the silicon film, which deteriorates due to ion doping. The energy density of the laser radiation is 100 to 400 mJ/$cm^2$, preferably 100 to 150 mJ/$cm^2$. Since a silicon oxide film containing phosphorus or boron absorbs ultraviolet radiation, where laser annealing is conducted subsequent to through-doping as in Example 1, intense laser light is needed. In the present example, however, if the silicon oxide film, or gate-insulating film, is removed after doping, less laser energy suffices. This can improve the throughput of the laser processing. In this way, N-type phosphorus-doped regions 308 and 309 are formed. The sheet resistance of these regions is 200 to 800 Ω/$cm^2$ (FIG. 3(C)).

Then, silicon oxide is deposited as an interlayer insulator 310 having a thickness of 2000 to 3000 Å over the entire surface by plasma CVD, LPCVD, or atmospheric pressure CVD. An aluminum film having a thickness of 2000 Å to 5 μm is formed as a wiring layer material. This aluminum is photolithographically patterned to form wiring layers 311 and 312 connected with the source and drain of a TFT. As shown, the wiring layer 312 crosses the wiring layer 307 (FIG. 3(C)).

Finally, the laminate processed in this way is annealed in a hydrogen at 350° C. for 30 minutes at 1 atm., thus completing hydrogenation of the laminate. In this way, a TFT is completed. At the same time, the doped region is doped with boron to fabricate a P-channel TFT. A CMOS is fabricated. Typical field mobilities of the N-channel and P-channel types are 80 to 150 cm$^2$/Vs and 40 to 100 cm$^2$/Vs, respectively. We have confirmed that a shift register constructed from these TFTs operated at 11 MHz when the drain voltage was 17 V.

Although a high voltage exceeding 20 V is applied to the gate and the drain for a long time (about 98 hours), the characteristics deteriorate only slightly. This is because heat generated locally in the TFTs is quickly dissipated, suppressing liberation of hydrogen atoms from the interface with the semiconductor coating and from the interface with the gate-insulating film. Heat generation state under a long time application of a bias (a gate voltage of 11 V and a drain voltage of 14 V) is practically confirmed by a thermography (manufactured by Nihon Abionics Co., Ltd). The result is that constant increase of temperature is not observed in the TFT of the present example and the temperature of the TFT is increased up to 50° C. at most. However, the temperature of the conventional TFT having no aluminum nitride film as a base film is increased to 100° C. or higher in a short period of time under the same condition to degrade the device characteristics extremely.

EXAMPLE 4

This example is to demonstrate the formation of pixel parts in an active matrix-type liquid crystal display. FIG. 4 and FIG. 5 illustrated example. Corning 7059 was used as the substrate 401. It is preferred that the substrate is annealed at a temperature higher than its strain temperature before or after having been coated with a subbing film and then gradually cooled to a temperature of not higher than its strain temperature at a cooling rate of from 0.1° to 1.0° C./min. This is because the contraction of the substrate that has been annealed in this way is small in the subsequent steps to be effected at elevated temperatures and therefore masks may be easily matched with the substrate. It is recommended that the present substrate Corning 7059 is annealed at 620° to 660° C. for 1 to 4 hours and then gradually cooled at a cooling rate of from 0.03° to 1.0° C./min, preferably from 0.1° to 0.3° C./min, and after having been cooled to a temperature of from 450° to 590° C., it is taken out. In this example, the substrate Corning 7059 was annealed at 630° C. for 4 hours and then gradually cooled at a cooling rate of 0.2° C./min.

Next, an aluminum nitride film 402 having a thickness of from 0.1 to 2 μm, preferably from 0.2 to 0.5 μm, for example 0.3 μm, was deposited on the substrate 401 by reactive sputtering. The sputtering was carried out in an atmosphere comprised of nitrogen and argon, using aluminum as the target. The proportion of nitrogen was preferably 20% or more to form a film with good thermal conductivity. The sputtering pressure was from $1\times10^{-4}$ to $1\times10^{-2}$ Torr by which a favorable result was obtained. The filming speed was from 20 to 200 Å/min. The temperature of the substrate may be elevated up to 100° to 500° C. during filming. The formation of the aluminum nitride film 402 may be carried out before the annealing of the substrate. Afterwards, an extremely thin subbing film 403 of silicon oxide having a thickness of from 0 to 1000 Å, preferably from 20 to 500 Å, for example 200 Å, was formed thereon by sputtering.

After having formed the subbing film, a true (I type) amorphous silicon film 404 having a thickness of from 300 to 1500 Å, for example, 1000 Å was formed thereon by plasma CVD. In addition, a mask film 405 of silicon oxide or silicon nitride having a thickness of from 200 to 2000 Å, for example 500 Å, was formed thereon by plasma CVD. A hole 406 was selectively formed through the mask film 405.

Next, a nickel film 407 having a thickness of from 5 to 200 Å, for example 20 Å, was formed thereon by sputtering. In place of the nickel film, a nickel silicide film (having the chemical formula NiSi$_x$ where $0.4 \leq x \leq 2.5$, for example x=2.0) may be employed. Since copper, palladium and the like, apart from nickel, also have similar catalytic activity for crystallizing amorphous silicon, they may be used for this purpose. (FIG. 4(A))

The thus-coated substrate was annealed in an inert atmosphere (nitrogen or argon, at atmospheric pressure), at 550° C. for 4 to 8 hours, for example 8 hours, to effect the intended crystallization. During this step, nickel was introduced into the silicon film through the part of the hole 406. Since nickel catalytically acts on amorphous silicon to accelerate the crystallization of the latter, the region 410 just below the hole 406 was first crystallized. However, the crystallinity in the region was not ordered. Afterwards, the crystallization extended from the region just below the hole 406 to the region around it with the diffusion of nickel and, hence, the crystallization was promoted in the direction shown by the arrows in the drawing whereby the region 409 was crystallized. Since the crystallization was promoted in one direction in the region 409, the crystallinity therein was good. The region 408 is a non-crystallized region. The dimension of the crystallized region depended on the annealing time.

If the mask 405 is too thin, nickel penetrates into the film 404 also through the other parts of the mask 405 than the hole 408 to initiate the crystallization. Such is unfavorable for obtaining good crystallinity in the region 409. For this reason, the mask 405 was had to have a thickness of at least 500 Å, line in this example. (See FIG. 4(B)).

After this step, the silicon film 404 was patterned by known lithography to form an active island layer 411 of TFT. In carrying out the step, it is important that the part that is to be the region from which a channel is formed must not contain both the leading part of the growth of crystals in the lateral direction (or, that is, the boundary between the crystallized region 409 and the non-crystallized region 408) and the part of the region 410 into which nickel has been introduced directly, since both of the parts have a large nickel concentration. In this way, the carriers moving between source and drain may not be influenced by the nickel elements in the region from which a channel is to be formed. In this example, nickel was selectively introduced into the silicon film and only the crystallizing region 409 in the lateral direction was used as the active layer of TFT. Without such selective introduction of nickel, nickel may be introduced uniformly into the silicon film to crystallize it. In the latter case (uniform introduction of nickel), however, the characteristics of TFT are relatively inferior to those of the same in the former case (selective introduction of nickel).

Figure 4A:
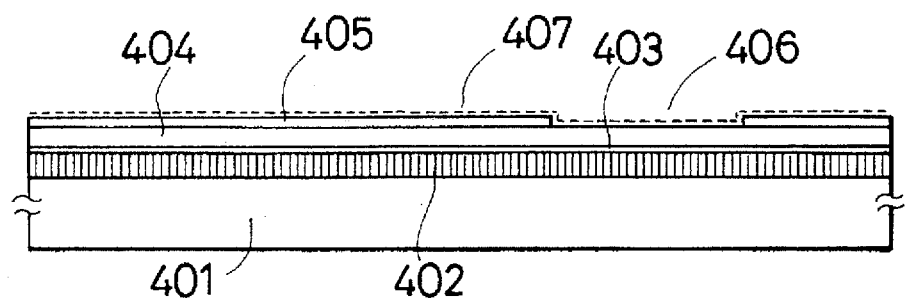
FIGS. 4(A) to 4(E) are cross-sectional views illustrating a method for forming a TFT in accordance with EXAMPLE 4 of the present invention.
Figure 4B:
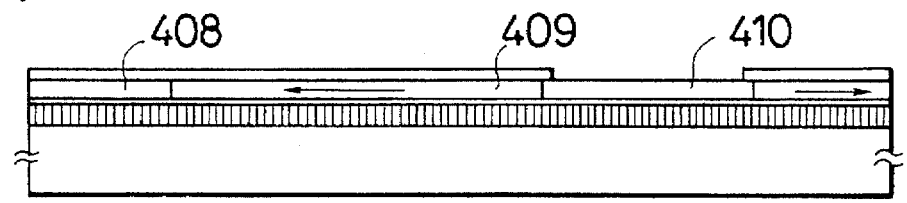
Figure 4C:
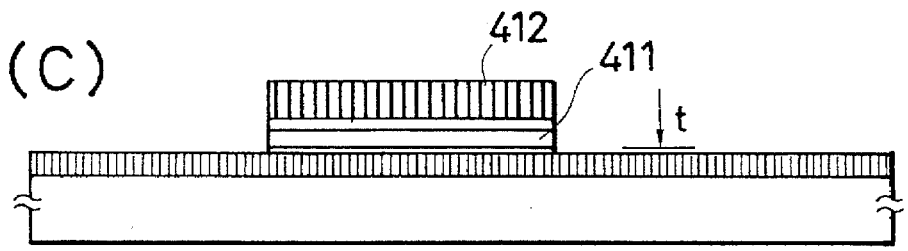
Figure 4D:
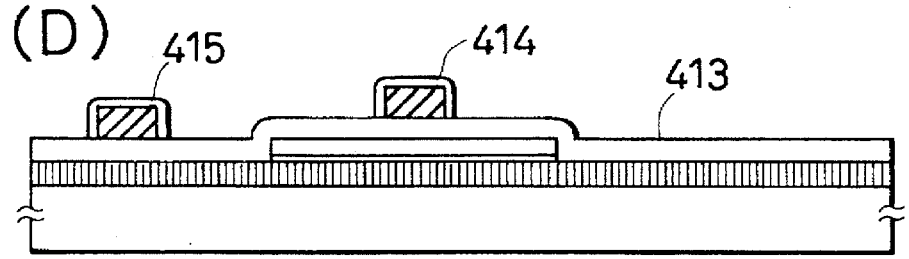
Figure 4E:
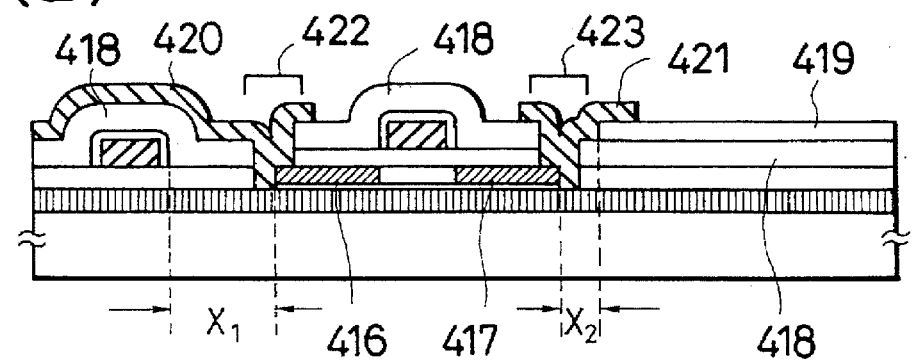

FIG. 4(C) shows the course of etching of the silicon film 404. Precisely, the active island layer 411 has thereon a mask film and a photoresist 412. During the etching step, the subbing silicon oxide film 403 was also etched. (FIG. 4(C))

After this step, it is necessary to peel off the photoresist and to further etch also the mask film on the active layer 411. This is generally effected using a hydrogen fluoride-containing etchant. In a conventional TFT process, since only silicon oxide film was used as the subbing film, the subbing film was also etched in the course of etching the mask film (in this case, the subbing film is etched at least 500 Å which is the thickness of the mask film). This was problematic. The difference of 500 Å in the level of the film was a serious factor in the cutting of the wires for the gate electrodes which will be formed later. For these reasons, it was considered necessary to make the mask film thin. However, if the mask film were made to be too thin, the above-mentioned selective crystallization could not proceed easily.

In comparison to the case using the conventional process, however, since the aluminum nitride film which is almost not etched with hydrofluoric acid was used as the subbing film in this example, only the mask film was selectively etched. The difference in question in the level of the film was only the sum of the thickness of the silicon film (1000 Å) and the thickness of the silicon oxide subbing film 408 (t=200 Å), and it did not cause the problem of the cutting of the wires of the gate electrodes formed later.

After the active layer was formed in the manner mentioned above, infrared rays having a peak in the range of the from 0.5 to 4 μm, and in this example those having a peak in the range of from 0.8 to 1.4 μm, radiated the layer for 30 to 180 seconds so as to further promote crystallization in the active layer. (The step is referred to as a photo-annealing or lamp-annealing step or RTP.) The temperature in this step was set at from 800° to 300° C., typically from 900° to 1200° C., or in this example 1100° C. The temperature was the temperature designated by the thermocouple located on the monocrystalline silicon substrate for monitoring but is not the real temperature of the surface of the substrate itself. In order to improve the condition of the surface of the active layer, the radiation was carried out in an $H_2$ atmosphere. In this step, since the active layer is selectively heated, the heating of the glass substrate may be depressed to the minimum. Radiation is extremely effective in reducing the defects and the dangling bonds in the active layer. The problem in this step was that the absorption of the radiating ultraviolet rays varied in the parts of the silicon film since selective crystallization was employed in this example. For instance, even in the active layer 411, it was observed that the right-hand part in the drawing easily absorbed the radiating ultraviolet rays as it contained a large amount of the crystal component while the left-hand part in the same drawing hardly absorbed them as it contained a large amount of the amorphous component.

In this example, however, since the aluminum nitride film with high thermal conductivity was used as the subbing film, the heat absorbed by the silicon film due to the radiation by the above-mentioned ultraviolet rays thereto was not accumulated in some particular sites in the silicon film but was immediately diffused through the subbing film. Therefore, the silicon film was uniformly heated without any thermal strain therein, and the uniformity of the silicon film was improved.

After this step, a silicon oxide film 413 having a thickness of 1000 Å was formed by plasma CVD as the gate insulation film. As the raw material gas for CVD, used were TEOS (tetraethoxysilane, $Si(OC_2H_5)_4$) and oxygen. The temperature of the substrate during the film formation was from 300° to 550° C., or for example 400° C.

After the formation of the silicon oxide film 413 which is to be the gate insulation film, the coated substrate was again subjected to photo-annealing by radiation with visible rays and near-infrared rays thereto. By the annealing, the layer located essentially in the interface between the silicon oxide film 413 and the active silicon layer 411 and also around it was eliminated. This is extremely useful in an insulated gate field effect semiconductor device wherein the interface characteristics between the gate insulation film and the channel-forming region are extremely important.

Subsequently, an aluminum film containing from 0.01 to 0.2% of scandium and having a thickness of from 3000 to 8000 Å, or in this example 5000 Å, was formed by sputtering. The aluminum film was patterned to form gate electrodes and wires. The surfaces of the aluminum electrodes and wires were oxidized by anodic oxidation to form an oxide film over the surfaces. The anodic oxidation was carried out using an ethylene glycol solution containing from 1 to 5% of tartaric acid. The thickness of the oxide layer thus formed was 2000 Å. In this way, the gate electrode part 414 (comprising the gate electrode and the oxide layer around it) and the wire part 415 were formed. For forming the gate electrodes, also usable are polycrystalline silicon, metals such as titanium, tungsten, tantalum, etc., and silicides of such metals, as a single layer or as plural layers. (FIG. 4(D))

Next, an impurity for yielding the self-ordered n-conductive type was added to the active layer region (source/drain; this forms a channel) by ion doping (or plasma doping), using the gate electrode part 414 as the mask. As the doping gas, used was phosphine ($PH_3$). The accelerated voltage was from 80 to 90 kV, or for example 80 kV. The dose was from $1 \times 10^{15}$ to $8 \times 10^{15}$ cm$^{-2}$, or for example, $2 \times 10^{15}$ cm$^{-2}$. As a result n-type impurity regions 418 and 417 were formed. As the impurity regions 418 and 417, a silicide such as titanium silicide or the like may be formed.

Afterwards, the substrate was annealed by irradiation of a laser ray thereto. As the laser ray, used was KrF excimer (having a wavelength of 248 nm and a pulse width of 20 nsec). Apart from this, other lasers may also be used. Regarding the conditions for the laser ray radiation, the energy density was from 20 to 400 mJ/cm$^2$, or for example 250 mJ/cm$^2$, and from 2 to 10 shots, or for example 2 shots, were applied to one site. During the laser ray radiation, the substrate may be heated up to about 200° to 450° C. so as to increase the effect.

The step may also be conducted by lamp annealing using visible and near-infrared rays. Visible and near-infrared rays may easily be absorbed by a crystallized silicon or by an amorphous silicon containing from $10^{19}$ to $10^{21}$ cm$^{-3}$ of phosphorus or boron. Using these rays, therefore, effective annealing comparable to heat annealing at 1000° C. or higher may be carried out. Silicon-containing phosphorus or boron may sufficiently absorb even near-infrared rays since the impurity scatters the rays. As it is black when observed with the naked eye, it may, in fact, be presumed that it is black. On the contrary, since the rays are hardly absorbed by the glass substrate, the glass substrate is not heated up to high temperatures during radiation with the rays thereto. In addition, since the radiation with the rays may be finished with in a short period of time, it is the best mode in a step in which it is desired that the troublesome contraction of the glass substrate be evaded. In this example, since the aluminum nitride film with high thermal conductivity was used as the subbing film, the heat imparted to the substrate did not accumulate only in one site thereof even in the annealing step and the substrate was not thermally broken. In particular, since aluminum which is not very heat-resistant was used for the gate electrodes, the use of the aluminum nitride film as the subbing film was preferred.

Next, a silicon oxide film 418 having a thickness of from 3000 to 8000 Å, or for example 8000 Å, was formed as the interlayer insulator, by plasma CVD. As the interlayer insulator, also usable is a film of polyimide or a two-layered film composed of silicon oxide and polyimide. In addition, an ITO film having a thickness of 800 Å was formed by sputtering, and this was patterned to form a pixel electrode 419. The interlayer insulator was etched using a buffered hydrofluoric acid (HF/NH$_4$F=0.01 to 0.2, for example, 0.1) to form contact holes 422 and 423. A multi-layer film of metal materials, such as titanium nitride and aluminum, was formed to give an electrode 420 and a wire 421 of TFT. Last, the substrate was annealed in a hydrogen atmosphere of one atmospheric pressure at 350° C. for minutes to complete a semiconductor circuit having a complementary TFT constitution. (FIG. 4(E))

Figure 5A:
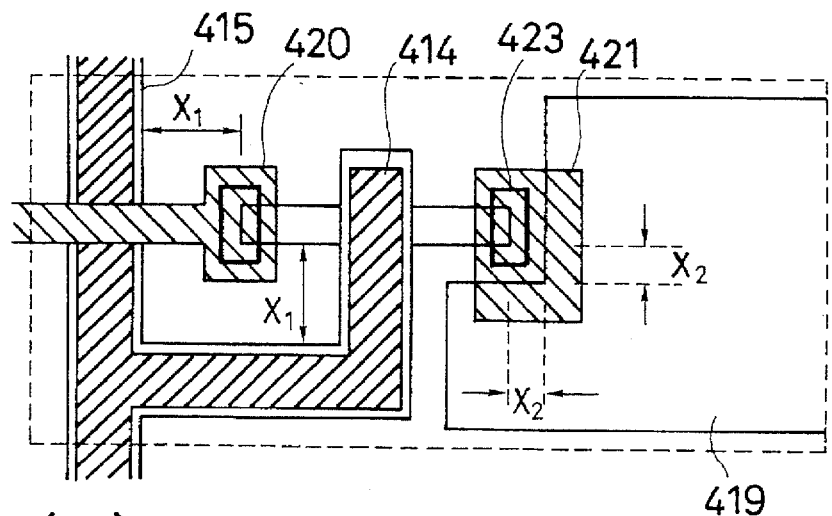
FIGS. 5(A) to 5(C) show a conventional TFT and a TFT of the present invention for comparison therebetween.

In this example, the contact holes 422 and 423 were formed at the edges of the active layer, while parts of them protected out of the active layer. Though having the profile, the substrate was almost not over-etched since the aluminum nitride film was used as the subbing film. Accordingly, TFT was formed with good producibility in this example. FIG. 5(A) shows a plan view of TFT produced by the present invention. The active layer 411 was linear and both ends thereof had the contact holes 422 and 423 that projected out of the active layer. The distance between the active layer and the gate wire 415 was $x_1$ and that between the active layer and the pixel electrode 419 was $x_2$. This is to prevent the overlapping of the lines due to misalignment. In this example, since the area of the active layer is small, the area of the pixel electrode may be made large while the exclusive area for the wiring may be made small.

Figure 5B:
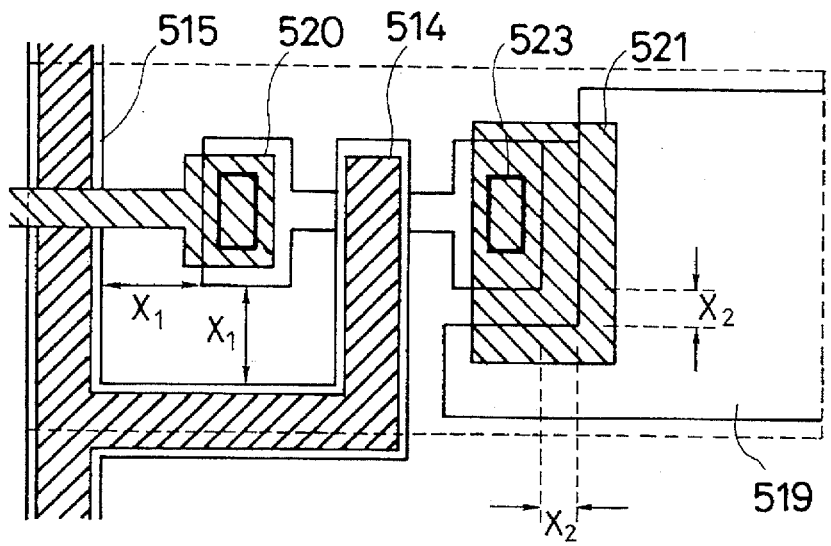
Figure 5C:
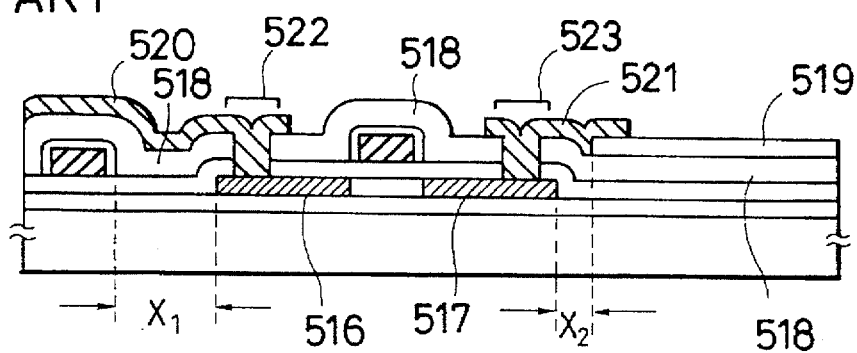
Figure 6A:
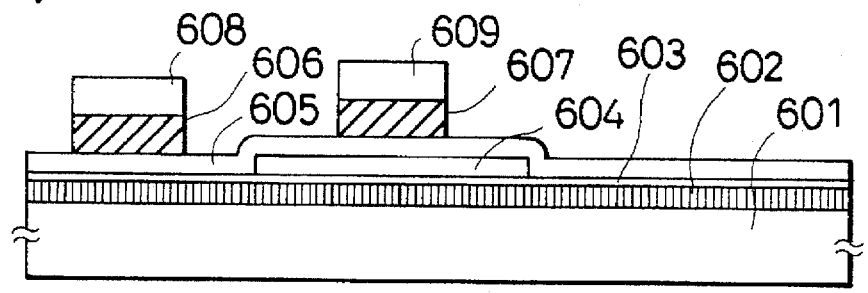
FIGS. 6(A) to 6(F) are cross-sectional views illustrating a method for forming a TFT in accordance with EXAMPLE 5 of the present invention.
Figure 6B:
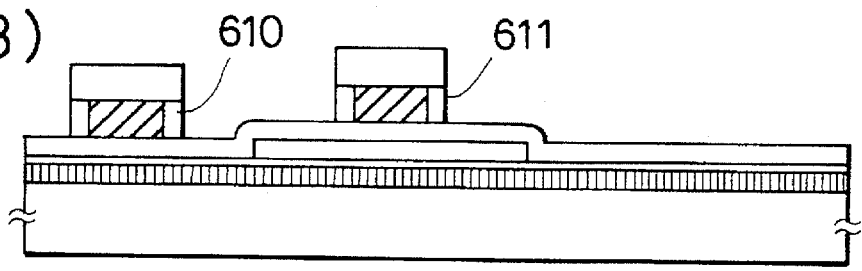
Figure 6C:
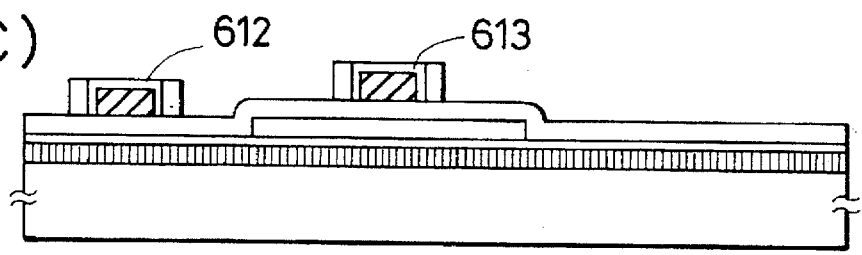
Figure 6D:
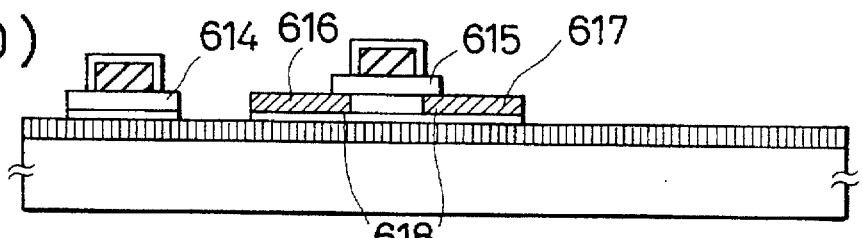
Figure 6E:
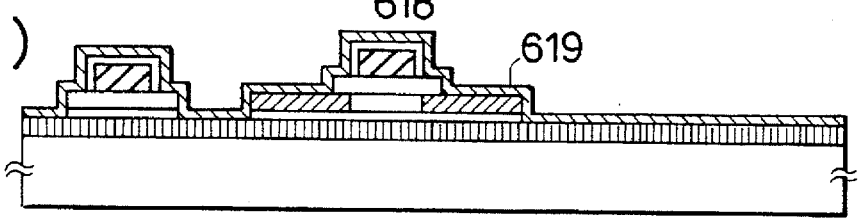
Figure 6F:
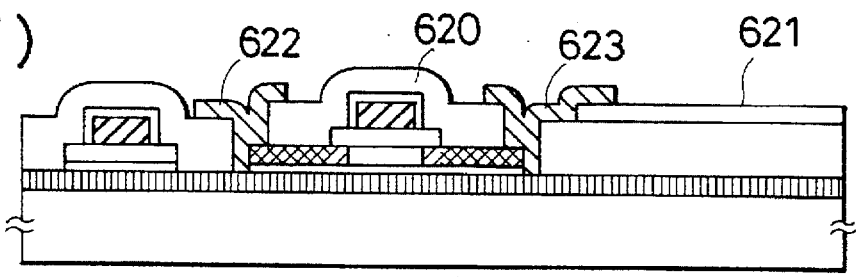

FIG. 5(B) shows a plan view of a conventional TFT, and FIG. 5(C) shows a cross-sectional view of FIG. 5(B). As is obvious from FIG. 5(B), the active layer was narrowed and thinned in the gate electrode part while it was thick in the source and drain regions. This surely forms the contact holes 522 and 523 on the source 518 and the drain 517 of the active layer. Therefore, even though the contact holes are misaligned due to over-etching, these are surely formed in the area of the active layer.

However, the structure mentioned above needs a large active layer area. If it is desired the distances $x_1$ and $x_2$ to separate from the active layer be provided so as to prevent the overlapping with the gate wire 515 and the pixel electrode 519, the wiring needs to be thick and the area of the pixel electrode needs to be reduced, as is obvious from the drawing. The rectangles formed by the dotted line in FIG. 5(A) and FIG. 5(B) have the same area. From this, it is understood that the exclusive area of TFT and that for the wiring to be connected therewith are large, while the area of the pixel is small in accordance with the conventional method. As opposed to this, it is understood that the exclusive area of TFT and that for the wiring to be connected therewith are small, while the area of the pixel is large in this example of the present invention.

As mentioned above, the ratio of pixel/wiring may be increased and, additionally, the opening ratio in a liquid crystal display device may be increased and the pixels may be made fine in this example of the present invention. These all result in an improvement in the quality of a liquid crystal display device.

EXAMPLE 5

This example is to demonstrate the formation of pixel parts in an active matrix-type liquid crystal display. FIG. 6 shows this example. Corning 7059 was used as the substrate 601. First, an aluminum nitride film 602 having a thickness of from 0.1 to 2 µm, preferably from 0.2 to 0.5 µm, or for example 0.3 µm, was deposited onto the substrate 601 by reactive sputtering, in the same manner as in Example 4. Next, an extremely thin subbing film 603 of silicon oxide having a thickness of from 0 to 1000 Å, preferably from 20 to 500 Å, for example 200 Å was formed thereover by sputtering.

After having formed the subbing film, a crystalline silicon island region 604 having a thickness of from 300 to 1500 Å, for example 800 Å, was formed thereover. In addition, a silicon oxide film 805 having a thickness of 1000 Å was formed thereon as the gate insulation film, by plasma CVD. As the raw material gas for CVD, used were TEOS and oxygen.

Afterwards, an aluminum film containing 1 wt. % of Si or from 0.1 to 0.3 wt. % of Sc and having a thickness of from 1000 Å to 3 µm, for example 6000 Å, was formed by electron beam deposition or sputtering. Then, a photoresist (for example, OFPR 800/30 cp, produced by TOKYO OHKA KOGYO CO., LTD.) was formed by spin-coating. Before the formation of the photoresist, it is recommended that an aluminum oxide film be formed having a thickness of from 100 to 1000 Å on the whole surface of the aluminum by anodic oxidation. Because the adhesiveness of the photoresist the aluminum film is improved. In addition, since the current leakage through the photoresist may be prevented with the presence of the aluminum oxide film, the formation of a porous anodic oxide on only the side surfaces of wires and electrode gates may be carried out favorably in the later anodic oxidation. Next, the photoresist and the aluminum film were patterned and etched to form a wire 606 and a gate electrode 607. The above-mentioned photoresists 608 and 609 remained on the wire and the gate electrode, and these act as the masks for preventing the anodic oxidation in the later anodic oxidation step. (FIG. 6(A))

Next, a current was imparted to the above-mentioned wire and gate electrode in an electrolytic solution to carry out anodic oxidation to thereby form anodic oxides 610 and 611 having a thickness of from 3000 Å to 25 µm, or for example 0.5 µm, on the side surfaces of the wire and the gate electrode. The anodic oxidation was carried out in an acidic aqueous solution, for example a 3 to 20% solution of citric acid, nitric acid, phosphoric acid, chromic acid, sulfuric acid or the like, while applying a constant current of from 5 to 30 V, or for example 8 V, to the gate electrode. The anodic oxides thus formed were porous. In this example, the anodic oxidation was carried out in an oxalic acid solution (at 30° to 80° C.) at a voltage of 8 V for 20 to 240 minutes. The thickness of the anodic oxides to be formed was controlled by varying the time and the temperature for the anodic oxidation. (FIG. 6(B))

Next, the masks 608 and 609 were removed, and a current was again imparted to the gate electrode and the wire in an electrolytic solution. This time, used was an ethylene glycol solution with a pH of about 7 containing from 3 to 10% of tartaric acid, boric acid or nitric acid. The temperature of the solution was preferably lower than room temperature, or for example about 10° C., to obtain better oxide films. In this step, barrier-type anodic oxides 612 and 613 were formed on the upper surfaces and the side surfaces of the gate electrode 606 and the wire 607. The thickness of the barrier-type anodic oxide films formed was proportional to the voltage applied. For instance, when the voltage applied was 100 V, then anodic oxide films of a thickness of 1200 Å were formed. In this example, since the voltage applied was increased to 100 V, the thickness of the barrier-type anodic oxides formed was 1200 Å. The thickness of the barrier-type anodic oxide films is not specifically defined, but if it is too small, aluminum will also be dissolved unfavorably when the porous anodic oxides are etched in a later step. For this reason, the thickness is to be preferably 500 Å or more.

It is to be noted that, although it is formed in a later step, the barrier-type anodic oxide was not formed outside of the porous anodic oxide but instead between the porous anodic oxide and the gate electrode. (FIG. 6(C))

Afterwards, the silicon oxide film 605 was etched by dry-etching. The etching may be effected either in a plasma mode for isotropic etching or in a reactive ion-etching mode for anisotropic etching. However, it is important that the selected ratio of silicon to silicon oxide is made sufficiently large so that the active layer is not too deeply etched. For instance, when $CF_4$ was used as the etching gas, the anodic oxide was not etched and therefore the silicon oxide films 614 and 615 existing below the gate electrode and wire remained unetched. Also in the etching step, the aluminum nitride film 602 acts as the stopper to prevent over-etching so that the difference in the level of the parts formed on the substrate was minimized.

Next, the porous anodic oxides 612 and 613 were etched using a mixed acid comprising phosphoric acid, acetic acid and nitric acid. A self-ordered impurity was injected into the active layer 604 of TFT by ion-doping, using the gate electrode part (including the gate electrode and the anodic oxide film around it) and the gate insulation film 615 as the masks. Various combinations are formed in the impurity region, depending on the ion-accelerating voltage and the ion dose. For instance, when the accelerating voltage is defined to be high, namely within a range of from 50 to 90 kV and the ion dose is defined to be low, namely within a range of from $1 \times 10^{13}$ to $5 \times 10^{14}$ $cm^{-2}$, then almost all the impurity ions pass through the active layer to have the maximum concentration in the subbing film. Accordingly, the concentration of the impurity in the regions 616 and 617 becomes extremely low. On the other hand, the speed of the high-speed ions is lowered by the gate insulation film 615 in the region 618 having thereon the gate insulation film, whereby the concentration of the impurity in the region 618 becomes maximized to form a region having a high impurity concentration.

On the contrary, however, when the accelerating voltage is defined to be low, namely within a range of from 5 to 30 kV and the ion dose is defined high to fall within the range of from $5 \times 10^{14}$ to $5 \times 10^{15}$ $cm^{-2}$ then a large amount of impurity ions are injected into the regions 616 and 617 to be regions having a high impurity concentration. On the other hand, low-speed ions are introduced into the region 618 having thereon the gate insulator film 615 due to the film 615 so that the amount of the ions to be injected into the region 618 is small and thereby a region having a low impurity concentration is formed. By either of these methods, the region 618 becomes a region having a low impurity concentration. This example may employ either of these methods.

The ion-doping was conducted in the manner mentioned above to form the n-type low-concentration impurity region 618. Then, a KrF excimer laser (having a wavelength of 248 nm and a pulse width of 20 nsec) radiated the substrate to thereby activate the impurity ions that had been introduced into the active layer. (FIG. 6(D))

Next, a film of a suitable metal, for example, titanium, nickel, molybdenum, tungsten, platinum, palladium or the like, for example a titanium film 619 having a thickness of from 50 to 500 Å, was formed wholly on the surface by sputtering. As a result, the metal film 619 (titanium film in this example) was formed to tightly adhere to the high-concentration (or ultra-low concentration) impurity regions 616 and 617. (FIG. 6(E))

Afterwards, a KrF excimer laser (having a wavelength of 248 nm and a pulse width of 20 nsec) radiated the substrate so as to activate the metal film (titanium film in this example) and the silicon in the active layer to thereby form metal silicide (titanium silicide in this example) regions 620 and 621. The energy density of the laser used was suitably from 200 to 400 $mJ/cm^2$, preferably from 250 to 300 $mJ/cm^2$. The substrate was preferably heated up to 200° to 500° C. during radiation using the laser, whereby peeling of the titanium film was inhibited.

Next, the non-reacted titanium film was etched, using an etching liquid of a 5:2:2 mixture comprising hydrogen oxide, ammonia and water. The parts of the titanium film which were not kept in contact with the exposed active layer (for example, those of the titanium film existing on the gate insulation film and the anodic oxide film) remained as a metal, but these could be removed by etching. On the other hand, since the titanium silicides 620 and 621, which exist in the form of metal silicides, were not etched, they remained as they were. In this example, the sheet resistivity in the silicide regions 620 and 621 was from 10 to 50 $\Omega/\square$, while that in the low-concentration impurity region 618 was from 10 to 100 $k\Omega/\square$.

Afterwards, a silicon oxide film having a thickness of from 2000 Å to 1 μm, for example 5000 Å was formed wholly on the surface as an interlayer insulator 622 by CVD. Next, an ITO film was formed thereon by sputtering, and this was pattern-wise etched to form a pixel electrode 623. In addition, the interlayer insulator 622 was etched to form a contact hole in the same manner as in Examples 1 and 4 to make such a pattern that the contact hole projected out of the source and the drain. The pattern improves the mass-producibility and the reliability of TFT, as mentioned above. Last, a wire 824 and an electrode 825 were made of a multi-layer film composed of titanium nitride and aluminum, having a thickness of from 2000 Å to 1 μm, for example 5000 Å. (FIG. 8(F))

The present invention permits fabrication of a TFT which shows high reliability even if a voltage is applied for a long time. Further, the device can be made fine by a high degree of freedom of arrangement of the active layer and the contact. In this way, the present invention is industrially very advantageous. Especially, where TFTs are formed on a substrate having a large area and used as an active-matrix circuit or as a driver circuit, great industrial advantages can be attained.

Although not described in the above examples, the invention can be applied to a three-dimensional IC structure where a semiconductor circuit is built on a single-crystal IC or the like. The above-described examples principally pertain to the use of the invention in various LCDs. Obviously, the invention may also be utilized in other circuits which are required to be formed on an insulating substrate such as an image sensor.

What is claimed is:

1. An electro-optical device comprising:
    a first film comprising aluminum nitride provided on a substrate;
    a second film comprising silicon oxide provided on said first film;
    a third film comprising silicon provided on and in contact with said second film; and
    a wiring comprising a material selected from the group consisting of a metal and a semiconductor, said wiring being provided on said third film with an insulator therebetween.

2. The device of claim 1 wherein said third film further comprises hydrogen.

3. The device of claim 1 wherein said second film comprising silicon oxide has a thickness of 100 to 1000 angstroms.

4. The device of claim 1 wherein said first film has a thickness of 500 Å to 5 μm.

5. The device of claim 1 wherein said first film has an aluminum to nitrogen ratio in the range of 0.9 to 1.4.

6. A semiconductor device comprising:
    a first film comprising aluminum nitride provided on a substrate;
    a second film comprising silicon oxide provided on said first film;
    a silicon island provided on and in contact with said second film;
    a gate insulating film provided on said silicon island; and
    a gate electrode provided on said gate insulating film.

7. The device of claim 6 wherein said second film comprising silicon oxide has a thickness of 100 to 2000 Å.

8. The device of claim 6 wherein said first film has a thickness of 500 Å to 5 μm.

9. The device of claim 6 wherein said first film has an aluminum to nitrogen ratio in the range of 0.9 to 1.4.

10. An electro-optical device comprising:
    a first film comprising aluminum nitride provided on a glass substrate;
    a second film comprising silicon oxide provided on said first film;
    a third film comprising silicon provided on and in contact with said second film; and
    a wiring comprising a material selected from the group consisting of a metal and a semiconductor, said wiring being provided on said third film with an insulator therebetween,
    wherein said first film contains an element selected from the group consisting of boron, silicon, carbon and oxygen.

11. The device of claim 10 wherein said second film comprising silicon oxide has a thickness of 100 to 2000 Å.

12. The device of claim 10 wherein said first film has a thickness of 500 Å to 5 μm.

13. The device of claim 10 wherein said first film has an aluminum to nitrogen ratio in the range of 0.9 to 1.4.

14. The device of claim 10 wherein said first film contains an element selected from the group consisting of boron, silicon, carbon and oxygen at 0.01 to 20 atom %.

15. An electro-optical device comprising:
    a first film comprising aluminum nitride provided on a substrate;
    a second film comprising silicon oxide provided on said first film;
    a third film comprising silicon provided on and in contact with said second film; and
    a wiring comprising a material selected from the group consisting of a metal and a semiconductor, said wiring being provided on said third film with an insulator therebetween,
    wherein said third film comprising silicon comprises a channel of a thin film transistor provided in said third film at a channel width of 200 to 800 μm.

16. A semiconductor device comprising:
    a first film comprising aluminum nitride provided on a substrate;
    a second film comprising silicon oxide provided on said first film;
    a silicon island provided on and in contact with said second film;
    a gate insulating film provided on said silicon island; and
    a gate electrode provided on said gate insulating film,
    wherein said silicon island comprises a channel of a thin film transistor provided in said silicon island at a channel width of 200 to 800 μm.

17. A semiconductor device comprising:
    a film comprising aluminum nitride having a thermal conductivity of 0.6 W/cm° K. or higher provided on a glass substrate;
    a silicon island provided on said film;
    a wiring comprising a material selected from the group consisting of a metal and a semiconductor, said wiring being provided on said silicon island with an insulator therebetween,
    wherein said silicon island comprises a channel of a thin film transistor provided in said silicon island at a channel width of 200 to 800 μm.

18. An electro-optical device comprising:
    a first film comprising aluminum nitride provided on a glass substrate;
    a second film comprising silicon oxide provided on said first film;
    a third film comprising silicon provided on and in contact with said second film; and
    a wiring comprising a material selected from the group consisting of a metal and a semiconductor, said wiring being provided on said third film with an insulator therebetween,
    wherein said first film contains an element selected from the group consisting of boron, silicon, carbon and oxygen, and
    wherein said third film comprising silicon comprises a channel of a thin film transistor provided in said third film at a channel width of 200 to 800 μm.

* * * * *